United States Patent [19]
Fuderer et al.

[11] Patent Number: 5,647,362
[45] Date of Patent: Jul. 15, 1997

[54] CORRECTION OF READ-GRADIENT POLARITY IN EPI AND GRASE MRI

[75] Inventors: Miha Fuderer; Johannes P. Groen, both of Eindhoven, Netherlands

[73] Assignee: U.S. Philips Corporation, New York, N.Y.

[21] Appl. No.: 306,095

[22] Filed: Sep. 14, 1994

[30] Foreign Application Priority Data

Sep. 16, 1993 [EP] European Pat. Off. ............ 93202678

[51] Int. Cl.$^6$ .................................................. A61B 5/055
[52] U.S. Cl. ................................. 128/653.2; 324/309
[58] Field of Search ...................... 128/653.2; 324/307, 324/309

[56] References Cited

U.S. PATENT DOCUMENTS

| | | | |
|---|---|---|---|
| 4,993,075 | 2/1991 | Sekihara et al. | 324/309 |
| 5,055,789 | 10/1991 | Kondo et al. | 324/309 |
| 5,084,675 | 1/1992 | Reinfelder et al. | 324/309 |
| 5,151,656 | 9/1992 | Maier et al. | 324/309 |
| 5,270,654 | 12/1993 | Feinberg et al. | 324/309 |
| 5,304,929 | 4/1994 | Fang et al. | 324/309 |
| 5,361,028 | 11/1994 | Kanayama et al. | 324/309 |
| 5,378,986 | 1/1995 | Seo et al. | 324/309 |

FOREIGN PATENT DOCUMENTS 9301509 1/1993 WIPO.

OTHER PUBLICATIONS

"Cartesian Echo Planar Hybrid Scanning with Two To Eight Echos" G. Kashmar et al, IEEE Transactions on Medical Imaging, 10(1991) Mar., No. 1, pp. 1–10.

"GRASE (Gradient and Spin–Echo) MR Imaging" A New Fast Clinical Imaging Technique D. Feinberg et al, Radiology, vol. 181, (1991) pp.597–602.

"Image Reconstruction for Echo Planar Imaging with Non-equidistant K–Space Sampling" H. Bruder et al, Magn. Reson. Med. vol. 23, pp. 311–323 (1992).

*Primary Examiner*—Marvin M. Lateef
*Assistant Examiner*—Brian L. Casler
*Attorney, Agent, or Firm*—Jack D. Slobod

[57] ABSTRACT

In an EPI or GRASE magnetic resonance method, phase errors caused by the alternation of the read gradient polarity ($G_x$) are corrected by obtaining a set of reference measurements with both polarities at low values in the phase encoding ($k_y$) direction. From these reference measurements the phase errors are estimated. Subsequently, the measurements covering the whole of k-space are corrected and a magnetic resonance image obtained in which artefacts due to the alternating polarity of the read gradient are suppressed.

15 Claims, 5 Drawing Sheets

CORRECTION OF READ-GRADIENT POLARITY IN EPI AND GRASE MRI

BACKGROUND OF THE INVENTION

1. Field of the Invention

The invention relates to a method and apparatus for magnetic resonance imaging of a body placed in a stationary and substantially homogeneous main magnetic field, in which after the application of an excitation radio-frequency pulse (RF-pulse)

magnetic field read gradient pulses having alternate positive and negative polarity are applied for generating a plurality of magnetic resonance signals and a first set of signal samples of said magnetic resonance signals is measured, such that the signal samples from the first set are located on lines running to and fro in k-space, the lines having a mutual distance in a direction substantially perpendicular to the direction of the lines, and also a second set of signal samples is measured with both polarities of the read gradient and from the second set a set of phase errors is determined, and by means of transformation and correction for phase errors, an image is formed from the first set of signal samples.

2. Description of the Related Art

Such a method is known from DE-A 40 05 675 and from the article "Image reconstruction for echo planar imaging with nonequidistant k-space sampling", by H. Bruder et al. in Magn. Reson. Med., Vol. 23, pages 311–323 (1992). In the known method, the first set of data is acquired with continuously switched on phase encoding gradient and alternating read gradient magnetic fields. Consequently, the acquired signal samples are located on slightly curved lines substantially extending in the read direction in k-space and spaced apart in the phase encoding direction. The lines cover substantially the whole of k-space. The signal samples of the second set are acquired without a phase encoding gradient, so all samples in this second set are located on a single line in the read direction, through the origin of k-space. The known method provides only a possibility to correct phase errors that are constant in the phase encoding direction. Errors that have also a varying effect in a direction perpendicular to the read direction cannot be corrected.

In U.S. Pat. No. 5,055,789 a method and device are described for correction of phase errors in two dimensions. According to that known method a measurement is made of inhomogeneities $\Delta H(x,y)$ in the stationary magnetic field and of the spatial non-linearity and the temporal variations of the gradient magnetic fields. These measurements are made beforehand by direct or indirect measurements of the magnetic fields. After data acquisition the signal samples acquired with a positive and with negative polarity read gradient are separated and image reconstruction is performed for both classes of data. Both images are separately corrected in accordance with the measured deviations of the magnetic fields and other relevant contributions. Finally the two images are synthesized into a single image.

The purpose of such measurements is to improve the quality of the magnetic resonance image to be obtained by correcting for the differences of sampled magnetic resonance signals that are acquired with a positive and a negative polarity read gradient.

In the second known method the deviations of the magnetic fields are evaluated by means of a time consuming and complicated measurement, involving the introduction in the stationary magnetic field of induction coils, phantoms and the like and deducing from that measurement the effects on magnetic resonance signals. During such a measurement the magnetic resonance apparatus cannot be used for clinical purposes. In addition, any change of the magnetic fields caused by the presence of an object or patient in the MRI device cannot be taken into account. Also, any drift, for example due to varying environmental conditions, in the deviations of the magnetic fields cannot be taken into account immediately. Other instrumental effects, such as timing effects and eddy currents, will also influence the phase and frequency encoding of the measurements.

SUMMARY OF THE INVENTION

It is, inter alia, an object of the invention to provide a method and a device for magnetic resonance imaging according to the introductory paragraph in which the different effects of positive and negative polarity read gradient are corrected, both in the read and the phase encoding directions, but in which no separate set of particular measurements to determine the deviations of the stationary and gradient magnetic fields is necessary.

To this end, a method according to the invention is characterized in that the signal samples of the second set are located on lines in, at least, a two-dimensional sub-region in k-space, and the same or closely adjacent lines in k-space are measured with both polarities of the read gradient, such that the signal samples measured in said sub-region with a given polarity of the magnetic field read gradient are located on lines being spaced apart at a distance being substantially equal or less than said mutual distance in the first set. The invention is based on the realization that information concerning the difference between samples measured with a positive and with a negative polarity read gradient, obtained from a relatively small region of k-space, can be used to estimate the behavior of the phase errors in the whole of k-space and subsequently to correct the phase errors of the signal samples in the first set. The same or closely adjacent lines in k-space are measured with both positive and negative polarity read gradient. In case of three-dimensional MRI the sub-region is two- or, possibly, three-dimensional.

Preferably, the method according to the invention is characterized in that the sub-region of k-space comprises a band which extends in the direction of the lines and in which the origin of k-space is located. As the phase error is a smooth function across the image, a reasonably good approximation can be obtained by measuring the low spatial frequencies in the image.

A first embodiment of the method according to the invention is further characterized in that the excitation RF-pulse or pulses after which said second set of signal samples is measured is separate from the excitation RF-pulse or pulses applied for measuring said first set of signal samples. In this embodiment measurements of the second set can be made, especially in their mutual timing, virtually identical to the measurements of the first set. In particular, the second set of measured samples can be obtained following a single excitation RF-pulse. Such a reference measurement preferentially precedes or follows the excitation or excitations for measuring the samples in the first set immediately or may be obtained in a separate reference measurement not immediately connected with an operational measurement.

A second embodiment is characterized in that signal samples in said second set of signal samples are measured following the same excitation RF-pulse as signal samples from said first set. The measurements of the second set in the sub-region of k-space are interleaved with the measurements of the first set. Hereby it is ascertained that the second set of measurements is acquired in the same conditions as the first set. So, phase errors from sources such as inhomogeneities of the static field due to the magnet or susceptibility variations in the patient, or due to chemical shift, are with certainty included in the estimation of the phase errors. Compared to the first embodiment, the number of excitation RF-pulses and measurement sequences for acquisition of all samples necessary for image reconstruction is reduced by one. It is remarked, that in the already mentioned article by H. Bruder et al. in Magn. Reson. Med., Vol. 23, pages 311–323 (1992), integration of the reference measurement within the original EPI sequence is discussed. However, what is disclosed in that article is a reference measurement without phase encoding added to a conventional EPI sequence. According to the present invention a set of lines is measured which covers a certain range in the phase encoding direction.

Preferably, this embodiment is further characterized in that measurements of the second set are integrated within a sequence of measurements of the first set by not applying phase encoding gradients at a moment of reversal of the polarity of read gradient pulses or by applying reduced phase-encoding gradients at such a moment. The omission of a phase encoding gradient means that the same phase encoding value is used for more than one read gradient pulse. A reduced value of the phase encoding gradient results in the measurement of closely adjacent lines with alternating read gradient polarity. In the latter case, the number of lines devoted to acquisition of the first set of signal samples is less affected.

The method according to the invention may be further characterized in that at least one refocusing RF-pulse is applied following the excitation RF-pulse and in that magnetic field read gradients are applied and the signal samples are measured following the respective RF-refocusing pulses. In an RF-refocused NMR signal more time is available for data sampling than in the free induction decay immediately following the excitation RF-pulse. Also, inhomogeneities of the stationary magnetic field have less influence in case a refocusing RF-pulse is applied. Sequences comprising a single excitation RF-pulse and zero or one refocusing RF-pulses are known as echo-planar imaging (EPI). A larger number of refocusing RF-pulses is possible as well. A magnetic resonance imaging technique with a plurality of excitation and refocusing RF-pulses, and a plurality of read gradient reversals, is known as GRASE and described by D. A. Feinberg and K. Oshio in the article "GRASE (Gradient and Spin-Echo) MR imaging: A new fast clinical imaging technique", published in Radiology, Vol 181 (1991), pages 597–602. In this sequence a different set of lines in k-space is measured following each refocusing RF-pulse.

The invention also relates to an apparatus for magnetic resonance imaging, arranged to operate in accordance with a method as described hereinbefore. According to the invention in such an apparatus is characterized in that the control means is further arranged for measuring the signal samples of the second set on lines in, at least, a two-dimensional sub-region in k-space, the same or closely adjacent lines in k-space being measured with both polarities of the read gradient, such that the signal samples measured in said sub-region with a given polarity of the magnetic field read gradient are located on lines being spaced apart at a distance being substantially equal or less than said mutual distance in the first set.

These and other, more detailed, aspects of the invention will now be elucidated by way of example with reference to the accompanying drawings.

DETAILED DESCRIPTION OF THE PREFERRED EMBODIMENTS

Figure 1:
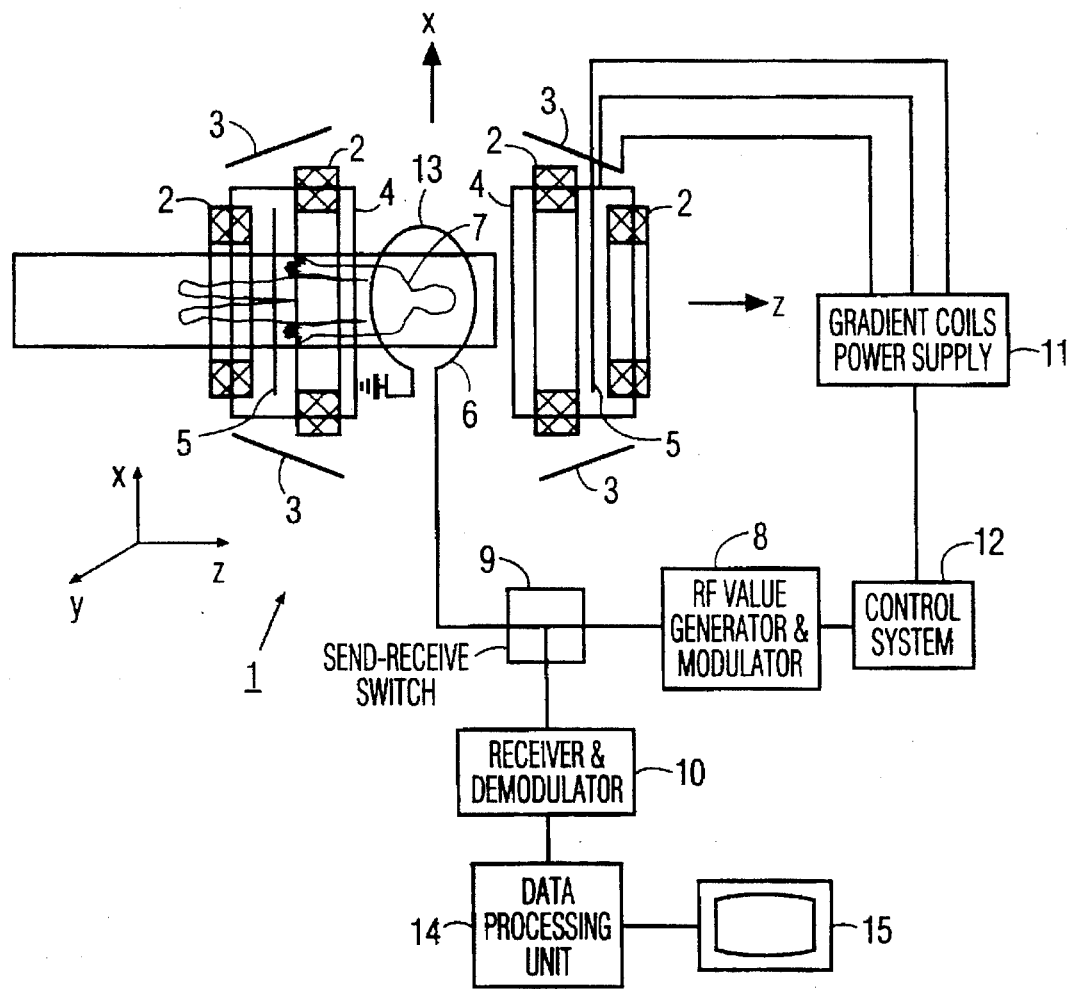
FIG. 1, diagrammatically a magnetic resonance imaging apparatus, suitable for the method according to the invention.

In FIG. 1 a magnetic resonance apparatus 1 is diagrammatically shown. The apparatus comprises a set of main magnetic coils 2 for generating a stationary and homogeneous main magnetic field and several sets of gradient coils 3, 4 and 5 for superimposing additional magnetic fields with controllable strength and having a gradient in a selected direction. Conventionally, the direction of the main magnetic field is labelled the z direction, the two directions perpendicular thereto the x and y directions. The gradient coils are energized via a power supply 11. The apparatus further comprises RF radiation emitting means 6, an antenna or coil, for emitting radio-frequency pulses (RF-pulses) to an object or body 7, the RF radiation emitting means being coupled to RF-pulse generator and modultor 8 for generating and modulating the RF-pulses. Also provided are means for receiving the NMR-signals, these means can be identical to the emitting means 6 or be separate. If the emitting and receiving means are identical, as shown in the figure, a send-receive switch 9 is arranged to separate the received signals from the pulses to be emitted. The received NMR-signals are input to a receiver and demodulator 10. The RF-pulse generator and modulator and the power supply 11 for the gradient coils 3, 4 and 5 are steered by a control system 12 to generate a predetermined sequence of RF-pulses and gradient field pulses. The receiver and demodulator 10 is coupled to a data processing unit 14, for example a computer, for transformation of the received signals into an image that can be made visible, for example on a visual display unit 15.

If the magnetic resonance apparatus 1 is put into operation with an object or body 7 placed in the magnetic field, a small excess of nuclear dipole moments (nuclear spins) in the body will be aligned in the direction of the magnetic field. In equilibrium, this causes a net magnetization $M_0$ in the material of the body 7, directed in parallel with the magnetic field. In the apparatus 1 the macroscopic magnetization $M_0$ is manipulated by radiating to the body RF-pulses having a frequency equal to the Larmor frequency of the nuclei, thereby bringing the nuclear dipole moments in an excited state and re-orienting the magnetization $M_0$. By applying the proper RF-pulses, a rotation of the macroscopic magnetisation is obtained, the angle of rotation is called the flip-angle. The intentional introduction of variations in the magnetic field by applying gradient magnetic fields influences the behaviour of the magnetization locally. After the application of RF-pulses, the changed magnetization will strive to return to a state of thermal equilibrium in the magnetic field, emitting radiation in the process. A well chosen sequence of RF-pulses and gradient field pulses causes this radiation to be emitted as NMR-signals which provide information about the density of a certain type of nuclei, for example hydrogen nuclei, and the substance in which they occur. By analysis of the emitted signals and presentation of it in the form of images, information about the internal structure of the object or body 7 is accessible. For a more detailed descriptions of magnetic resonance imaging (MRI) and MRI-devices reference is made to the extensive literature on this subject, for example to the book "Practical NMR Imaging", edited by M. A. Foster and J. M. S. Hutchison, 1987, IRL Press.

Figure 2:
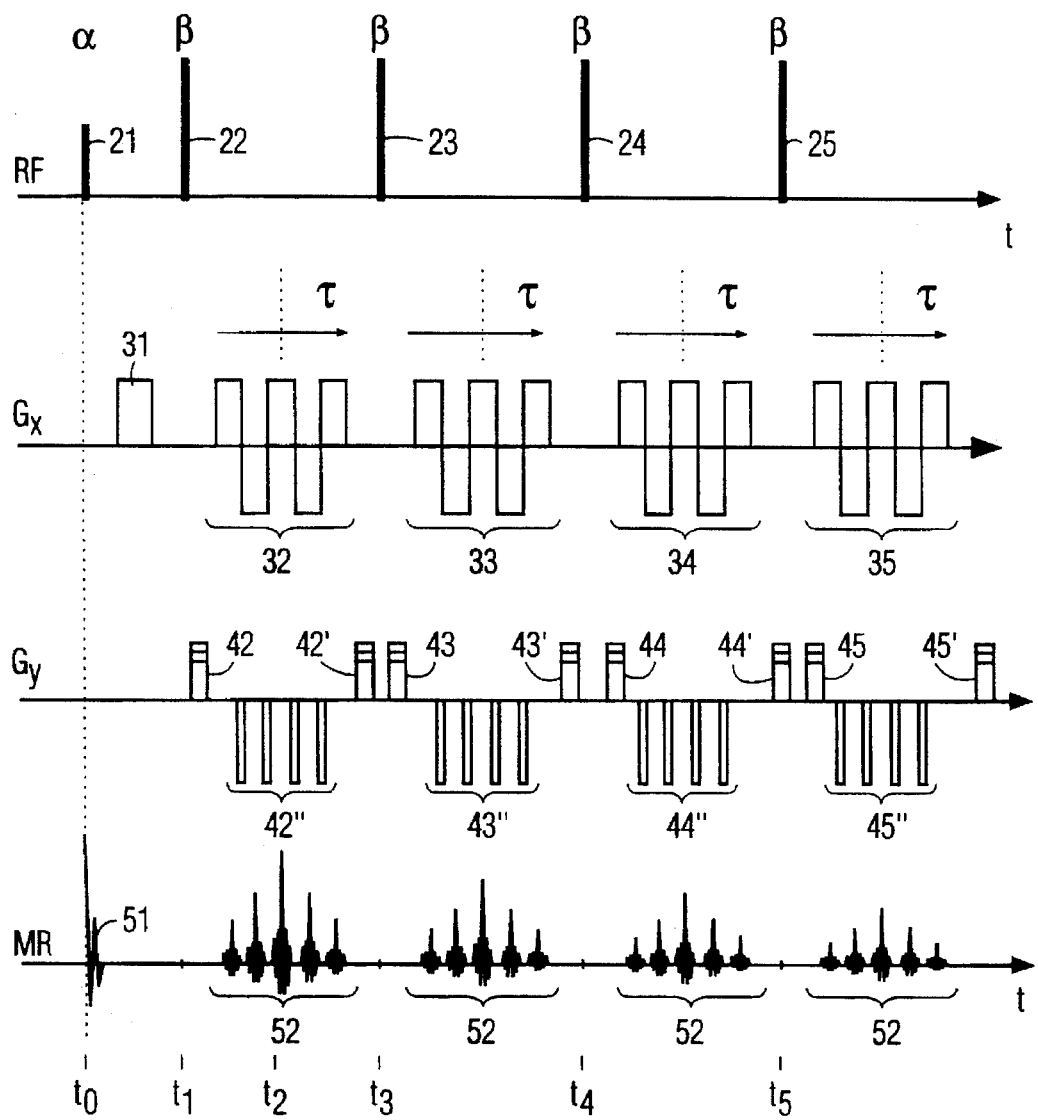
FIG. 2, a sequence of an excitation RF-pulse, a plurality of refocusing RF-pulses and reversal gradient pulses as known from the prior art.

FIG. 2 shows a known sequence of RF-pulses and magnetic field gradients according to the so-called GRASE method. The figure shows four rows, labelled RF, indicating the occurrence of RF-pulses as a function of time, $G_x$ and $G_y$, indicating the occurrence of magnetic gradient fields in the x- and y-directions, respectively, and MR, indicating the occurrence of the magnetic resonance signals in the body caused by the RF and gradient pulses.

At time $t_0$ an excitation RF-pulse 21 is applied having a flip-angle $\alpha$, followed at time $t_1$ by a first refocusing RF-pulse 22 having a flip-angle $\beta$. The values of $\alpha$ and $\beta$ are usually chosen to be 90° and 180°, respectively. Sequences with flip-angles deviating from these values are, however, possible. Following the excitation RF-pulse 21, a free induction decay (FID) nuclear magnetic resonance signal 51, indicated in the row MR, is generated which vanishes rapidly when the individual precessing nuclear magnetic dipole moments lose phase coherence (dephase) due to local variations in the magnetic field. The refocusing RF-pulse 22 reverses the direction of these individual magnetic dipole moments without affecting the local magnetic field. Consequently, dephasing is reversed into a rephasing which, in the absence of magnetic field gradients, would result at a time $t_2$, being equal to $2 \cdot t_1$ in an NMR spin-echo signal. However, as indicated in the row $G_x$, prior to the refocusing RF-pulse 22 a magnetic field 31 with a gradient in the x-direction is applied that also causes dephasing of the nuclear spins. After reversal of the spins by the refocusing RF-pulse 22 a train 32 of read magnetic field gradients with alternating polarity, is applied. This causes compensation of the dephasing of the spins, resulting in the occurrence of a so-called field or gradient echo and subsequent renewed dephasing. Hereinafter, each section of this train between reversals is termed a lobe of the read gradient. Each subsequent lobe causes the generation of a further echo signal, resulting in a series 52 of magnetic resonance echo signals. The sequence can be repeated a number of times by repetition of refocusing RF-pulses 23, 24, 25, ... with flip-angles $\beta$ at times $t_3, t_4, t_5, \ldots$, and subsequent trains 33, 34, 35, ..., of read gradient pulses with alternating polarity resulting in series of echo signals 53, 54, 55, .... The times $t_3, t_4, t_5$ are normally chosen such that $t_3=3 \cdot t_1$ and that the intervals in between the refocusing RF-pulses are of equal length $2 \cdot t_1$. The time since a refocusing RF-pulse is indicated by a time parameter $\tau$ which is zero at the moment of the spin-echo, i.e. the point in time to which the exciting RF-pulse is "mirrored" by the preceding refocusing RF-pulses.

Also following the refocusing RF-pulses 22, 23, 24, 25, respectively, phase-encoding gradient field pulses are applied with the gradient in the y-direction, as indicated in the row $G_y$. These gradients are applied in pairs 42–42', 43–43', 44–44', 45–45', . . . , the second pulse in a pair removing the phase-encoding. At the moments of reversal of the read gradient fields additional blips 42", 43", 44", 45", . . . in the $G_y$-gradient are applied, modifying the phase encoding values of the echo signals. As a result of the applied gradient magnetic fields, the measured samples of the magnetic resonance (echo) signals are distributed over the whole of k-space on parallel lines in the $k_x$-direction.

Figure 3:
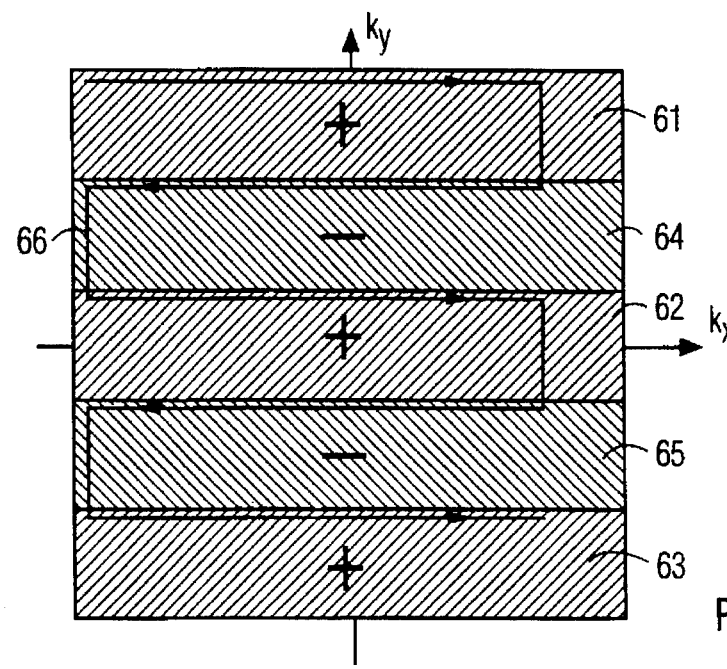
FIG. 3, diagrammatically the regions in k-space in which data are acquired with a positive and with a negative polarity of the read gradient in the sequence shown in FIG. 2.

In FIG. 3 the regions 61, 62 and 63 of k-space in which samples are acquired with a positive polarity read gradient are indicated with a "+" and the regions 64, 65 of samples acquired with a negative polarity read gradient with a "−". During the periods that the read gradient has a positive polarity samples are acquired in chronological order from left to right and when the read gradient is negative, samples are acquired from right to left. This is illustrated by the trajectory 66, illustrating the path in k-space followed after the first refocusing RF-pulse 22. FIG. 3 shows the ideal situation, in which both the positive and negative polarity read gradient pulses are equal. In practice, due to inhomogeneities in the stationary magnetic fields and transients, i.e. switching delays and induced eddy currents in the MRI device, the positive and negative polarity read gradient pulses differ somewhat. These effects cause phase shifts $\phi_+$ and $\phi_-$, for the positive and negative polarity read gradient pulses, respectively, which phase shifts manifest themselves during reconstruction of the MR image as if samples in k-space are shifted. For example, due to timing effects and eddy currents, such shifts can occur both in the $k_x$ and $k_y$-directions.

Figure 4:
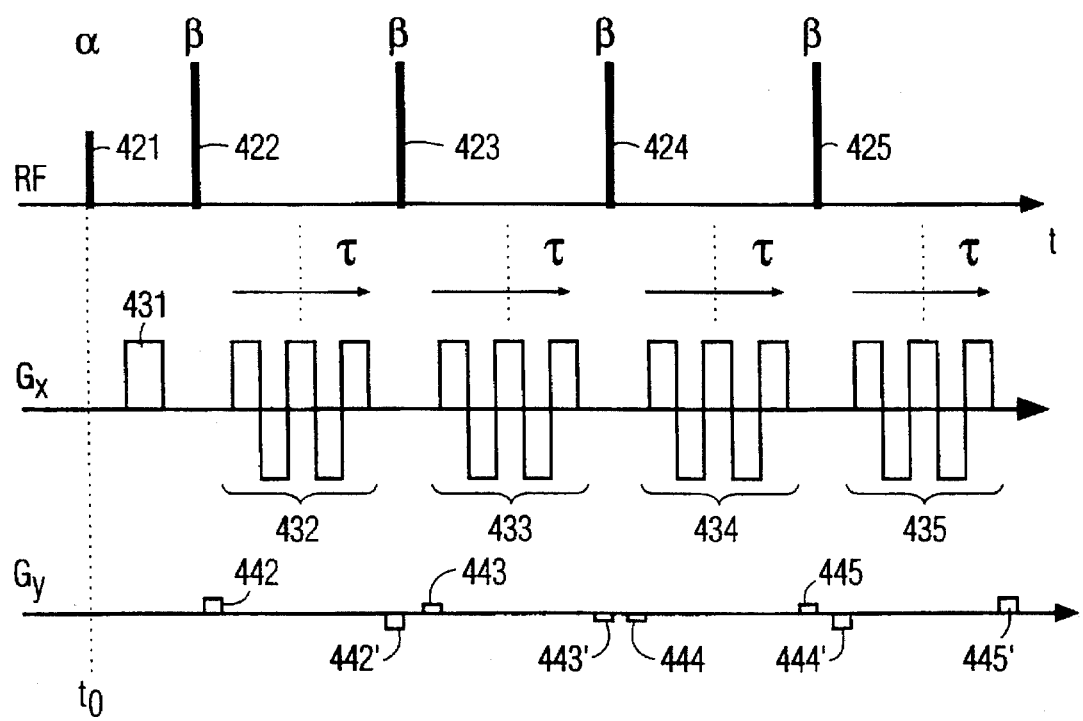
FIG. 4, a sequence having an excitation RF-pulse and a plurality of refocusing RF-pulses with gradients applied for a reference measurement.

The phase shifts $\phi_+(x,y)$ and $\phi_-(x,y)$, in particular the dependence in y, can be determined by means of a reference measurement comprising a spatial encoding in the y-direction. An example of a reference measurement is illustrated in FIG. 4, for a sequence having an RF- and gradient pulse sequence with more than one refocusing RF-pulse. The illustrated sequence concerns a separate reference measurement. Apart from the phase encoding gradients, this reference sequence is identical to the sequence shown in FIG. 2. Excitation and refocusing RF-pulses 421, 422, 423, 424 and 425 with flip-angles $\alpha$ and $\beta$, respectively, are applied, as well as read gradients, 431, 432, 433, 434 and 435 and phase encoding gradient pairs 442–442', 443–443', 444–444', 445–445'. The phase encoding gradients have a time integrated strength that is substantially less than the time integrated strength of the corresponding phase encoding gradients in a normal measurement sequence as shown in FIG. 2. No magnetic field gradient blips are applied at the moments of reversal of the read gradient field $G_x$. Accordingly, in the reference measurement the samples are located on a number of lines in k-space, close to the line $k_y=0$, each of the lines being sampled with positive and with negative polarity of the read gradient magnetic field $G_x$. As samples with low $|k_y|$ value in the normal measurements are acquired during the central portions of the read gradients, i.e. halfway in time between the refocusing RF-pulses, it is preferred to use that same portion of the reference measurement to obtain the phase shift values. This will minimize the effects of inhomogeneities in the stationary main magnetic field. In the illustrated read gradient fields, this would be the samples acquired during the third and fourth lobes for early refocusing RF-pulses or the second and third lobes for late refocusing RF-pulses. More generally stated, the reference samples from the second set should be acquired with substantially the same time parameter τ as the normal samples of the first set with the same (low) $k_y$ values. In case only one half of k-space is sampled, with the low $k_y$ values at the beginning or the end of a train of read pulses, the early or late samples in the reference set are preferably to be used. The set of samples acquired with a positive polarity read gradient in this reference measurement has a similar spacing in k-space as the complete set of samples, i.e. with positive and negative polarity read gradient, in the normal measurement. The same holds true for the samples in the reference measurement acquired with a negative polarity read gradient. In a variation, blips can be applied at some of the reversals of the read gradient field to increase the number of lines acquired, while decreasing the number of times a single line is acquired, provided that each line is scanned with both polarities of the read-out gradient.

Figure 5:
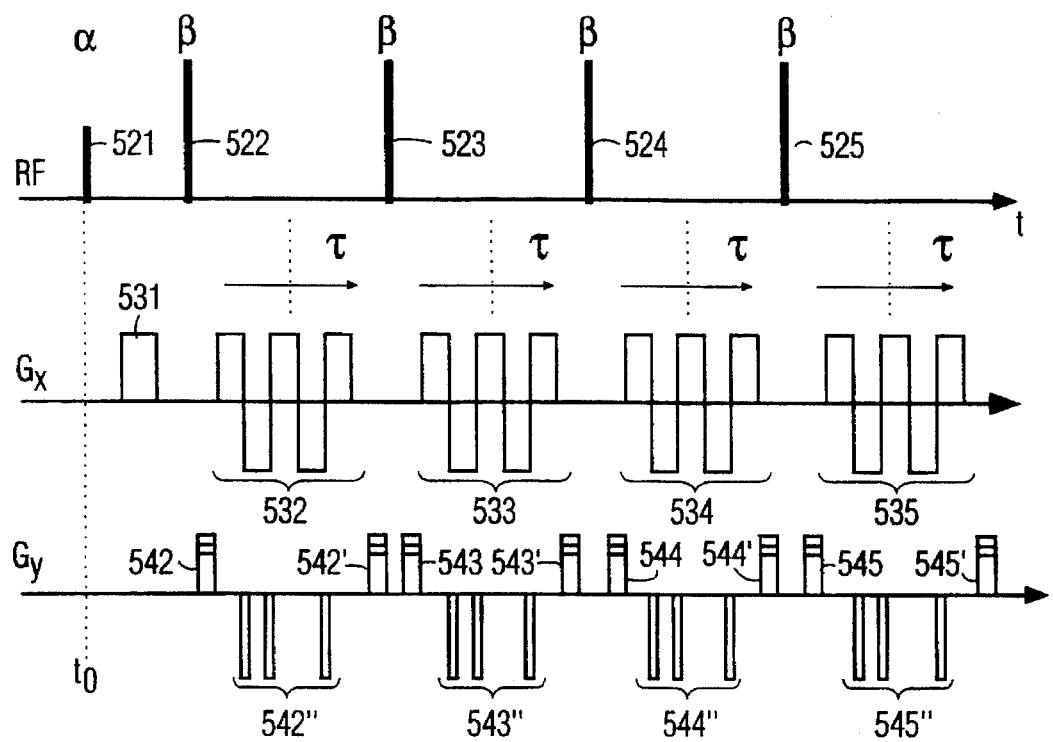
FIG. 5, an example of a sequence of RF pulses and magnetic field gradients in which the measurements of the first and second sets of magnetic resonance signal samples are integrated.
Figure 6:
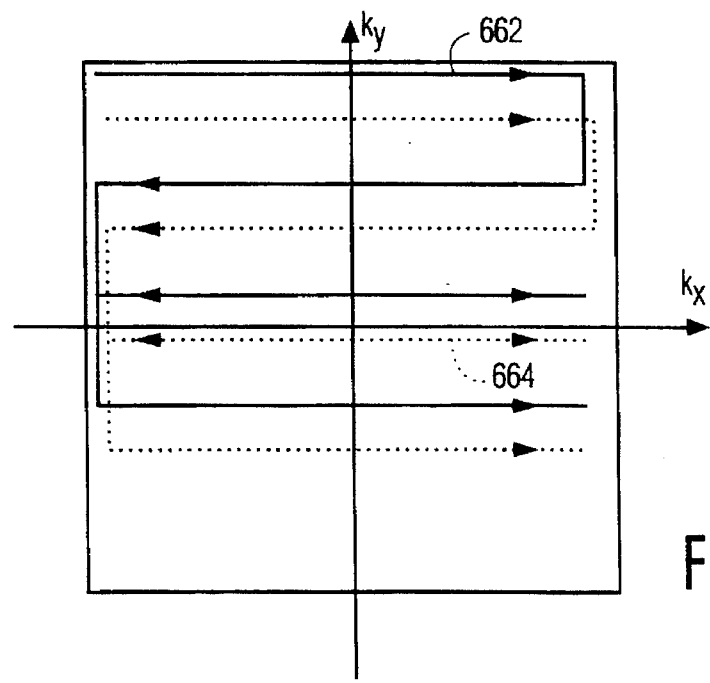
FIG. 6, the trajectory in k-space corresponding to the sequence of FIG. 5.

FIG. 5 shows a sequence of RF pulses and magnetic field gradients in which the measurements of the first and second sets of magnetic resonance signal samples are acquired following the same excitation RF-pulse. FIG. 6 shows the corresponding trajectory in k-space. The sequence shown in FIG. 5 is largely identical to the sequence shown in FIG. 2. Excitation and refocusing RF pulses 521, 522, 523, 524 and 525 are alternated with a dephasing read gradient 531 and trains 532, 533, 534 and 535 of read gradient lobes with alternate polarity. Phase encoding gradient pairs 542–542', 543–543', 544–544' and 545–545' are applied as well as blips 542", 543", 544" and 545" for sampling on a trajectory covering a large area of k-space. In contradistinction to the sequence of FIG. 2, at one reversal of the read gradient no blip is applied. Consequently, the line in k-space corresponding the accumulated value of the time-integrated strength of the phase encoding gradient is sampled twice, once with a positive and once with a negative polarity read gradient. As illustrated in FIG. 6, the trajectories 662 and 664 in k-space each comprise one line scanned in positive and in negative $k_x$-direction with the same $k_y$-value. It can also be seen from FIG. 6 that some portion of k-space is not scanned, in the shown embodiment shown, the lowest region. In practice this does not have a serious effect on the resulting image quality, the same information is available from another portion of k-space and the portions with high phase encoding values are of less importance anyway in the final reconstructed image.

In this interleaved way of acquiring the data, a clear distinction between samples belonging to the first and to the second set can no longer be made. One and the same signal sample can be used both in the process of evaluating the phase errors as in the final reconstruction.

To take the influence of static field inhomogeneities into account during the estimation of the phase errors, the samples acquired with a positive and negative polarity read gradient should be acquired close to the spin-echo time, i.e. close to τ=0. In a sequence as discussed with reference to FIG. 2, this point τ=0 is a time interval $t_1$ after the refocusing F-pulse. The sequence shown in FIG. 5 conforms to this recommendation. Field inhomogeneities may be, for example, due to the magnet, to susceptibility variations in the patient or to chemical shift.

In the following a method is described, by way of example, to obtain an image corrected for phase errors starting from first and second sets of sampled magnetic resonance signals acquired in sequences as described hereinbefore, i.e. from an "operational" and a "reference" set of signal samples. In the example described, phase correction is substantially performed in the spatial domain.

In a first embodiment of the correction procedure, as a first step two two-dimensional Fourier transforms are performed on signal samples that belong to the first (operational) set, one Fourier transform using only the samples acquired with a positive polarity read gradient and one using only the samples acquired with a negative polarity read gradient. This is done by replacing the samples acquired with the opposite polarity gradient by zero during each of the transformations, i.e. multiplying the sampled data with "presence" functions $W_+(k_y)$ and $W_-(k_y)$, respectively, which are 1 for those $k_y$ values at which data are sampled with a positive and negative polarity read gradient, respectively, and are zero for other $k_y$ values. Hereinafter, the results of these transforms will be called the "uncorrected positive partial image" and the "uncorrected negative partial image". In the second step a two-dimensional Fourier transform is performed using samples acquired at the sub-region in k-space that are measured with both polarity read gradient (the reference set), this yields two "correction images", a positive one $S_{ref,+}(x,y)$ and a negative one $S_{ref,-}(x,y)$, from which two phase error sets are obtained according to $\phi_\pm(x,y)=\arg(S_{ref,\pm}(x,y))$. In the third step, the phase patterns of the uncorrected positive and negative partial images are independently corrected with the respective phase errors $\phi_\pm(x,y)$, resulting in corrected positive and negative partial images. Next the phase corrected complex values from the partial images are to be combined by complex addition. Finally, the calculation of the modulus, as usual in magnetic resonance imaging, completes the reconstruction.

In this process, it has to be taken into account that a region of k-space is measured more than once. If the first and second sets of measurements were acquired during the same sequences, a simple addition of the positive and negative partial images would distort the image as the corresponding frequencies would be artificially emphasized. An additional problem that might occur is that, due to the phase errors, the regions of k-space actually sampled differ from the regions indicated by the nominal values of the phase encoding gradient $G_y$, this means a shift in the $k_y$-direction. For a similar reason a shift in $k_x$-direction is also possible. Consequently, it may happen that some portions of k-space are unintentionally measured twice and some parts not at all.

In a second, more elaborate, embodiment of a correction procedure these problems are addressed. In the description hereinafter, the symbols written as a capital relate to the $(x,k_y)$ space, i.e. after a one-dimensional Fourier transform in the read-direction. Symbols written as a small character relate to image (x,y) space. An index "+" or "−" indicates that use of the magnetic resonance samples acquired with a positive and a negative polarity read gradient, respectively. For shorthand "±" is used to indicate that a symbol or formula is to be evaluated twice, once for "+" and once for "−". An index "c" indicates the use of only data located in the sub-region of k-space that was sampled with both polarities of the read gradient (the central region). A tilde " ̃" indicates "phase corrected" and an asterisk "*" complex conjugated. ℑ denotes a Fourier transform, the direction of a one-dimensional Fourier transform is indicated by an index.

In this embodiment, the correction starts with a one-dimensional Fourier transform of the measured signal samples, performed in the read (x) direction: $S_\pm(x,k_y) = \mathfrak{I}_x\{S_\pm(k_x,k_y)\}$. Next a Fourier transform in the phase encoding (y) direction is performed using these functions, resulting in the uncorrected positive and partial images: $s\pm(x,y) = \mathfrak{I}_y\{S_\pm(x,k_y)W_\pm(k_y)\}$. The functions $W_+(k_y)$ and $W_-(k_y)$ are the previously discussed "presence" functions. A similar transform is performed for only the central region in k-space and for the "presence" functions $W_\pm$: $s_{c\pm}(x,y) = \mathfrak{I}_y\{S_{c\pm}(x,k_y)\}$ and $w_\pm(y) = \mathfrak{I}_y\{W_\pm(k_y)\}$. The function $f(k_y)$ is a window function, preferably a Riesz- or Tukey-function, with which the samples from the central region may be multiplied. The use of such a window function reduces the effects of a sudden discontinuity at the edges of the central region. The uncorrected positive and negative partial images can now be corrected according to:

$$\tilde{s}_\pm(x,y) = s_\pm(x,y) s^*_{c\pm}(x,y)/|s_{c\pm}(x,y)|.$$

The two partial images have to be added. This occurs in the $(x,k_y)$ domain as it is there that the polarity of the read gradient and the number of measurements for each $k_y$ value is known. The corrected partial images $\tilde{s}_\pm(x,y)$ first have to be transformed into that domain, as well as the corrected "presence" functions $\tilde{w}_\pm(x,y)$:

$$\tilde{S}_\pm(x,k_y) = \mathfrak{I}_y^{-1}\{\tilde{s}_\pm(x,y)\} \text{ and } \tilde{W}_\pm(x,k_y) = \mathfrak{I}_y^{-1}\{\tilde{w}_\pm(x,y)\}.$$

The phase correction of the presence function is performed in the spatial domain according to $\tilde{w}_\pm(y) = e^{-iy\phi_\pm(x)} w_\pm(y) = e^{-iy\phi_\pm(x)} \mathfrak{I}_y\{W_\pm(k_y)\}$. The average linear phase increase $\phi_\pm(x)$ is estimated as:

$$\phi_\pm(x) = arg\left[\sum_y \frac{s_{c\pm}(x,y) s_{c\pm}^*(x,y-1)}{\sqrt{|s_{c\pm}(x,y)||s_{c\pm}(x,y-1)|}}\right].$$

The normalization performed, division the square root of the product of the two absolute values, is not really essential. By doing so the weighted average phase increase is calculated. After determination of the corrected partial images and the corrected presence functions, the optimally weighted combined data are then given by:

$$\tilde{S}_\Sigma(x,k_y) = \frac{\tilde{W}_+^*(x,k_y)\tilde{S}_+(x,k_y) + \tilde{W}_-^*(x,k_y)\tilde{S}_-(x,k_y)}{|\tilde{W}_+(x,k_y)|^2 + |\tilde{W}_-(x,k_y)|^2}$$

and the complete phase corrected image is now obtained by Fourier transforming this data into the spatial domain: $\tilde{s}_\Sigma(x,y) = \mathfrak{I}_y\{\tilde{S}_\Sigma(x,k_y)\}$. The usual further processing of MR images, such as calculation of the modulus is to be performed using the data from this complex image $\tilde{s}_\Sigma(x,y)$.

It may occur that the denominator in the combination formula is small. In the present embodiment this means that both functions $\tilde{W}_+(x,k_y)$ and $\tilde{W}_-(x,k_y)$ are small. This may be avoided by choosing the trajectories in k-space such that regions measured with positive and negative polarity read gradients overlap to some (small) extent.

The methods described hereinbefore provide proper results only if the phase errors are not due to errors caused by switching the phase encoding gradients $G_y$. This assumption need not be valid, for example, due to eddy currents the actual value of the gradient magnetic field may vary during a sequence as a function of the switching history of $G_y$. This means that after presence or absence of a blip, the remnant gradient will be different. The effects of this difference can be reduced by introduction of two blips, each with a reduced time-integrated strength. The measurements of the same line in k-space measured with a positive and a negative polarity read gradient are then measured during different echoes or even are preceded by different excitation RF-pulses. However, as phase errors do not significantly depend upon the rank number of the excitation RF pulse nor upon $T_2$, this does not introduce any further errors. Additionally, in this procedure the number of lines devoted to acquisition of the first set of signal samples is less affected.

A problem remaining is that the magnetic resonance signals sampled with positive and negative polarity read gradients are sampled at different values of the time parameter $\tau$. After correction of the phase errors as described hereinbefore, inhomogeneities in the static magnetic field in combination with this differences in time $\tau$, generate a further phase difference in the magnetic resonance samples acquired with positive and negative polarity read gradients. This further phase difference is the cause of some additional, however less severe, artefacts.

To evaluate this further phase difference, its dependence on the time parameter $\tau$ has to be determined. In an embodiment of the invention, this can be done by measuring three times the magnetic resonance signals in the central portion of k-space and around $\tau=0$ alternatively with positive and negative polarity read gradients, or vice versa. If the second set of measurements is determined following a separate excitation RF-pulse and without phase encoding gradient blips at the reversals of the read gradient, i.e. the sequence as shown in FIG. 4, the central lobe and the two adjacent lobes of the read gradient train can be used. In case the second set is measured in the same sequences as wherein the first set is measured, two blips of the phase encoding gradient are to be absent in a measurement sequence, i.e. the sequence shown in FIG. 5 with also the second blip in $G_y$ absent. For one polarity of the read gradient, the phase error is to be determined from the central lobe and for the other polarity from the two adjacent lobes.

Correction of the data can be performed according to procedure described with the following formulas. An index "+" or "−" indicates partial images from measurements with positive or negative read polarity gradient pulses, respectively. Indices "e" and "l" are used for partial images from data measured before and after $\tau=0$, an index "c" is used for partial images from the lobes scanning low $k_y$-values, normally the central lobe or the lobes immediately adjacent thereto. As hereinbefore, tilde "~" and asterisk "*" are used for phase corrected and complex conjugated data, respectively.

Assuming that the read gradient polarity of the central lobe is positive, the phases $\phi_e$ and $\phi_l$ due to the inhomogeneity of the static field are determined by:

$$\exp(i2\phi_l(x,y)) = \exp(-i2\phi_e(x,y)) = \frac{s_{-l,c}(x,y)/|s_{-l,c}(x,y)|}{s_{-e,c}(x,y)/|s_{-e,c}(x,y)|},$$

wherein $s_{-e,c}(x,y)$ and $s_{-l,c}(x,y)$ are the partial images obtained from the negative lobes adjacent to the central lobe. As, in practice, the magnetic field inhomogeneities are minor, the phases $\phi_e$ and $\phi_l$ can be determined unambiguously.

The corrected images are obtained by the following calculations:

$$\tilde{s}_{-e}(x,y) = s_{-e}(x,y) \frac{s_{-e,c}^*(x,y)}{|s_{-e,c}(x,y)|};$$

-continued $$\tilde{s}_{+,e}(x,y) = s_{+,e}(x,y) \frac{s_{+,c}*(x,y)}{|s_{+,c}(x,y)|} \exp(-i\phi_e);$$

$$\tilde{s}_{+,l}(x,y) = s_{+,l}(x,y) \frac{s_{+,c}*(x,y)}{|s_{+,c}(x,y)|} \exp(-i\phi_l);$$

and $$\tilde{s}_{-,l}(x,y) = s_{-,l}(x,y) \frac{s_{-,l,c}*(x,y)}{|s_{-,l,c}(x,y)|}. \text{These}$$

partial images are to be combined by the weighted addition as described hereinbefore.

An additional advantage of the use of three central lobes for correction, is the improved symmetry. Because of this symmetry, artefacts, due to $T_2$ decay are present only in the imaginary part of the final phase corrected image, and can be avoided easily by use of the real part, rather than the modulus of the data representing the image. A further important advantage of the invented correction method is that it is not necessary to measure the whole of k-space. Apart from a region around $k_y=0$, only the positive, or negative, half of k-space needs to be measured. In such a measurement the region around $k_y=0$ is measured in the beginning or at the end of a read gradient train, at a value of the time parameter $\tau$ significantly different from zero. From the region around $k_y=0$, measured three times, an estimate can be made of the phase errors and the data can be corrected using the procedure according to the present invention. After correction, the samples in the unmeasured region of k-space can be estimated, for example as indicated in EP-A 0 250 050.

Figure 7A:
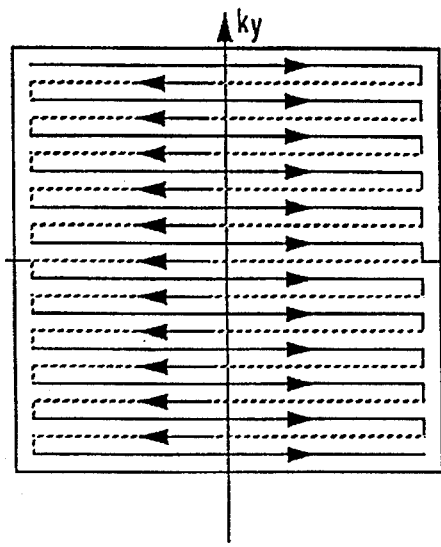
FIGS. 7a to 7d, an illustration of a measurement to obtain reference samples for the determination of phase errors during positive and negative polarity read gradient pulses.
Figure 7B:
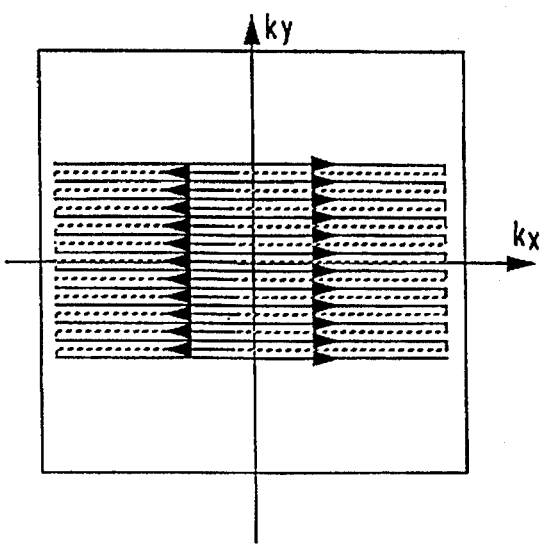
Figure 7C:
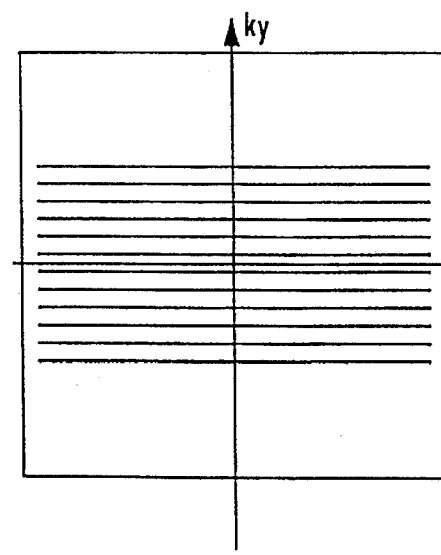
Figure 7D:
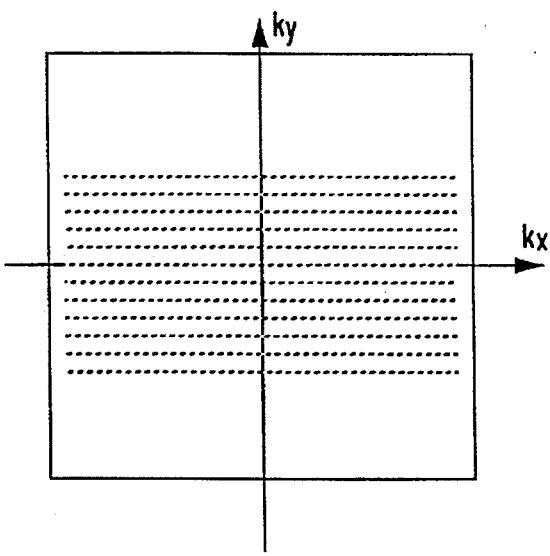

A further embodiment of the method according to the invention, for a sequence measuring k-space with no or a single refocusing RF-pulse, is illustrated with reference to FIGS. 7a to 7d. In FIG. 7a the trajectory in k-space for a normal measurement is illustrated. FIG. 7b shows the trajectory for a reference measurement, in which the distance in the phase encoding direction $k_y$ between the scan lines is halved as compared to the normal measurement. This is achieved by applying the phase encoding gradients $G_y$ in the reference sequence with a time-integrated strength that is half the time-integrated strength of the corresponding gradient in the normal sequence. As shown in FIGS. 7c and 7d, these samples are separated in a set sampled with a positive polarity read gradient (FIG. 7c) and with a negative read polarity gradient (FIG. 7d). From the reference measurements two partial images, $S_{ref,+}(x,y)$ and $S_{ref,-}(x,y)$ are reconstructed, one using the signal samples acquired with a positive polarity read gradient and one using the "negative" samples. These partial positive and negative images can be obtained by a Fourier transformation in which the other samples are replaced by zero. As the phase encoding was applied at half-strength both images have the double field-of-view (FOV) of the normal measurement. By leaving out one quarter of the image at both sides in the y-direction, two images are obtained that correspond to the desired FOV. The phase distributions $\phi_+(x,y)$ and $\phi_-(x,y)$ are derived from the two images, respectively, according to $\phi_\pm(x,y)=\arg(S_{ref,\pm}(x,y))$.

From the samples acquired in the normal measurement two partial images $s_+(x,y)$ and $s_-(x,y)$ are derived in the same way, by taking only samples acquired with a positive and with negative polarity read gradient, respectively, the other samples being replaced by zero. If no phase errors would occur the total image would be the sum of these two images $s_+(x,y)$ and $s_-(x,y)$. In case phase errors are present, a corrected image $\tilde{s}(x,y)$ can be achieved in the spatial domain by combining the two partial images according to:

$$\tilde{s}(x,y) = \frac{s_+(x,y)\exp\left(-i\phi_+\left(x,y-\frac{L}{2}\right)\right) + s_-(x,y)\exp\left(-i\phi_-\left(x,y-\frac{L}{2}\right)\right)}{\cos\left(\phi(x,y)-\phi\left(x,y-\frac{L}{2}\right)\right)},$$

in which $$\phi(x,y) = \frac{\phi_+(x,y)-\phi_-(x,y)}{2}$$

and L the field of view. As the numerator may not become zero, a requirement is that $$\left|\phi(x,y)-\phi\left(x,y-\frac{L}{2}\right)\right|<\frac{\pi}{2}.$$

This means that in k-space the sequence of "positive" and "negative" lines within the $k_y$ range sampled is maintained. For a good signal to noise ratio, a more severe requirement is needed to keep the numerator close to one, for example:

$$\left|\phi(x,y)-\phi\left(x,y-\frac{L}{2}\right)\right|<\frac{\pi}{4}.$$

A single reference measurement can, of course, be used to correct a plurality of repeated images, for example for studying time dependent phenomenons such as the inflow or outwash of a contrast medium, or activities in the brain.

We claim:

1. Method for magnetic resonance imaging of a body placed in a stationary and substantially homogeneous main magnetic field, the method comprising:

applying an excitation radio-frequency pulse (RF-pulse) for excitation of nuclear dipole moments in at least a portion of the body, followed by switching a plurality of magnetic field read gradient pulses having alternate positive and negative polarity, for generating a plurality of magnetic resonance signals in the excited portion, and simultaneously measuring a first set of signal samples of said magnetic resonance signals, such that said signal samples from said first set are located on lines running to and fro in k-space, the lines having a mutual distance in a direction substantially perpendicular to the direction of the lines, measuring a second set of signal samples with both polarities of the read gradient and determining from said second set a set of phase errors, and forming, by transforming and correcting for phase errors, an image from the first set of signal samples, wherein the signal samples of the second set are located on spaced apart lines in, at least, a two-dimensional sub-region in k-space, the same lines in k-space being measured with both polarities of the read gradient or pairs of said lines which are closely adjacent in relation to said mutual distance in said first set being measured with respective different polarities of the read gradient such that the signal samples measured in said sub-region with a given polarity of the magnetic field read gradient are located on lines being spaced apart at a distance being substantially equal to or less than said mutual distance in the first set.

2. Method according to claim 1, wherein the sub-region of k-space comprises a band which extends in the direction of the lines and in which the origin of k-space is located.

3. Method according to claim 2, wherein a further excitation RF-pulse is applied after which said second set of signal samples is measured, said further excitation RF-pulse being applied separate from the excitation RF-pulse applied prior to measuring said first set of signal samples.

4. Method according to claim 2, wherein the signal samples in said second set of signal samples are measured following the same excitation RF-pulse as the signal samples from said first set.

5. Method according to claim 4, wherein the measurements of the second set are integrated within a sequence of the measurements of the first set by not applying phase encoding gradients at a moment of reversal of the polarity of read gradient pulses or by applying reduced phase-encoding gradients at such a moment.

6. Method according to claim 5, wherein at least one refocusing RF-pulse is applied following the excitation RF-pulse and the magnetic field read gradients are applied and the signal samples are measured following the respective RF-refocusing pulse.

7. Method according to claim 2, wherein at least one refocusing RF-pulse is applied following the excitation RF-pulse and the magnetic field read gradients are applied and the signal samples are measured following the respective RF-refocusing pulse.

8. Method according to claim 1, wherein a further excitation RF-pulse is applied after which said second set of signal samples is measured, said further excitation RF-pulse being applied separate from the excitation RF-pulse applied prior to measuring said first set of signal samples.

9. Method according to claim 8, wherein at least one refocusing RF-pulse is applied following the excitation RF-pulse and the magnetic field read gradients are applied and the signal samples are measured following the respective RF-refocusing pulse.

10. Method according to claim 1, wherein the signal samples in said second set of signal samples are measured following the same excitation RF-pulse as the signal samples from said first set.

11. Method according to claim 10, wherein the measurements of the second set are integrated within a sequence of the measurements of the first set by not applying phase encoding gradients at a moment of reversal of the polarity of read gradient pulses or by applying reduced phase-encoding gradients at such a moment.

12. Method according to claim 10, wherein at least one refocusing RF-pulse is applied following the excitation RF-pulse and the magnetic field read gradients are applied and the signal samples are measured following the respective RF-refocusing pulse.

13. Method according to claim 1, wherein at least one refocusing RF-pulse is applied following the excitation RF-pulse and the magnetic field read gradients are applied and the signal samples are measured following the respective RF-refocusing pulse.

14. Method according to claim 1, wherein the magnetic resonance signals from the first set are acquired from substantially one half of k-space.

15. Apparatus for magnetic resonance imaging of a body when placed in an examination zone comprising means for establishing a stationary and substantially homogenous main magnetic field in the examination zone, means for generating gradient magnetic fields superimposed upon the main magnetic field, means for radiating RF-pulses into the examination zone, control means for controlling the generation of the gradient magnetic fields and the RF-pulses, means for receiving and sampling magnetic resonance signals generated by sequences of RF-pulses and switched gradient magnetic fields to measure signal samples, and reconstruction means for forming an image from said signal samples by transformation and phase correction, said control means being arranged for applying an excitation RF-pulse for excitation of nuclear dipole moments in at least a portion of the body, followed by switching a plurality of magnetic field read gradients having alternate positive and negative polarity, for generating a plurality of magnetic resonance signals in the excited portion, and simultaneously measuring a first set of signal samples of said magnetic resonance signals, such that said signal samples from said first set are located on lines running to and fro in k-space, the lines having a mutual distance in a direction substantially perpendicular to their direction, measuring a second set of signal samples with both polarities of the read gradient and determining from said second set a set of phase errors, for the determination of a set of phase errors from said second set, and measuring the signal samples of the second set on spaced apart lines in, at least, a two-dimensional sub-region in k-space, the same lines in k-space being measured with both polarities of the read gradient or pairs of lines in k-space which are closely adjacent in relation to said mutual distance in said first set are measured with respective different polarities of the read gradient, such that the signal samples measured in said sub-region with a given polarity of the magnetic field read gradient are located on lines being spaced apart at a distance being substantially equal to or less than said mutual distance in the first set.

* * * * *